(12) United States Patent
Börner et al.

(10) Patent No.: US 6,234,648 B1
(45) Date of Patent: May 22, 2001

(54) LIGHTING SYSTEM

(75) Inventors: Herbert F. Börner, Aachen; Wolfgang Busselt, Roetgen; Thomas Jüstel, Aachen; Hans Nikol, Aachen; Cornelis R. Ronda, Aachen, all of (DE); Gerard Harbers, s'Hertogenbosch (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/406,284

(22) Filed: Sep. 24, 1999

(30) Foreign Application Priority Data

Sep. 28, 1998 (EP) .................................................. 98203247
Mar. 10, 1999 (EP) .................................................. 99200723

(51) Int. Cl.[7] .................................................. H05B 43/00
(52) U.S. Cl. .................................. 362/235; 362/227; 362/800; 362/84; 362/293; 362/231; 362/545; 313/499; 313/512; 313/312; 313/313
(58) Field of Search .................................. 362/227, 800, 362/84, 293, 231, 545; 313/499, 512, 312, 313

(56) References Cited

U.S. PATENT DOCUMENTS

| 5,850,126 | * | 12/1998 | Kanbar | 362/800 |
| 5,851,063 | | 12/1998 | Doughty et al. | 362/231 |
| 6,068,383 | * | 5/2000 | Robertson et al. | 362/84 |

* cited by examiner

*Primary Examiner*—Sandra O'Shea
*Assistant Examiner*—Anabel M Ton
(74) *Attorney, Agent, or Firm*—Dicran Halajian

(57) ABSTRACT

A lighting system includes at least two light-emitting diodes each emitting, in operation, visible light in a preselected wavelength range. A converter converts part of the visible light emitted by one of the diodes into visible light in a further wavelength range so as to optimize the color rendition of the lighting system. The diodes include a blue light-emitting diode and a red light-emitting diode. Further, the converter includes a luminescent material for converting a portion of the light emitted by the blue light-emitting diode into green light.

20 Claims, 4 Drawing Sheets

LIGHTING SYSTEM

BACKGROUND OF THE INVENTION

The invention relates to a lighting system comprising at least two light-emitting diodes, each of said light-emitting diodes emitting, in operation, visible light in a preselected wavelength range.

Lighting systems based on light-emitting diodes (LEDs) are used as a source of white light for general lighting applications.

A lighting system of the type mentioned in the opening paragraph is known. In recent years, apart from red light-emitting diodes based on GaP, also efficient, blue light-emitting diodes and green light-emitting diodes based on GaN have been developed. In order to produce white light, in principle, three LEDs are necessary as the primary light source, namely a blue, a green and a red LED.

It is a drawback of such lighting systems that a combination of three LEDs as the primary light source does not always lead to the desired color rendition, which can be attributed to the fact that LEDs with spectral maxima in the desired spectral regions which at the same time are sufficiently energy-efficient are not available or short.

SUMMARY OF THE INVENTION

It is an object of the invention to provide a lighting system, which exhibits an improved color rendition. The invention further aims at improving the luminous efficacy of the lighting system.

To achieve this, the lighting system includes conversion means for converting a part of the visible light emitted by one of the light-emitting diodes into visible light in a further wavelength range so as to optimize the color rendition of the lighting system.

The conversion means are excited by light originating from one of the at least two LEDs. A part of this light is converted by the conversion means, for example via a process of absorption and emission, into visible light in the further wavelength range. This results in a lighting system which comprises, in fact, three light sources, namely two primary light sources which are formed by the at least two LEDs, which primary light sources each emit visible light in a preselected wavelength range, and one so-called secondary light source which emits visible light in the further wavelength range. By a suitable choice of the wavelength ranges in which these two primary light sources and the secondary light source emit visible light, a lighting system is obtained having an improved color rendition relative to a lighting system based on the two primary light sources. Since the application of a third primary light source (for example a green LED or a red LED) is avoided, an improved color rendition of the lighting system is obtained.

Preferably, the conversion means comprise a luminescent material. Such materials are very suitable because they generally have a high quantum efficiency and a high lumen equivalent (expressed in 1m/W), so that a high luminous efficacy of the lighting system is obtained. In addition, many varieties of (stable) inorganic and organic luminescent materials (phosphors) are known, so that the selection of a material for achieving the aim in accordance with the invention (improving the color rendition) is simplified.

The color rendition of the lighting system can be influenced in two ways. On the one hand, the spatial color rendition is improved by optimally mixing the light originating from the LEDs and the conversion means. On the other hand, the color rendition of the lighting system is improved by taking measures which make sure that the light output of the LEDs is independent of time. Such dependence is obtained, for example, if the light output of a LED changes as a function of the temperature of the LED. In this case, the use of temperature-independent LEDs has advantages.

In accordance with a first aspect of the invention, the luminescent material can be preferably excited by light originating from the wavelength range of 400 to 500 nm. By virtue of this sensitivity, the luminescent material can very suitably be used to absorb, in particular, blue light. This absorbed light is very efficiently converted by the luminescent material into visible light in the further wavelength range, for example green light.

Suitable luminescent materials are $(Sr, Ca)_2SiO_4:Eu^{2+}$, $Ba_2SiO_4:Eu^{2+}$, $SrGa_2S_4$, $ZnS:Cu^+$, $ZnS:Au^+$, $ZnS:Al^{3+}$, $(Zn, Cd)S:Ag^+$ and $CaS:Ce^{3+}$. Said materials have a relatively high quantum efficiency and light absorption at 450 nm. These materials further exhibit a relatively very high lumen equivalent when blue light is converted to the desired green light.

A very attractive embodiment of the lighting system in accordance with a first aspect of the invention is characterized in that the two light-emitting diodes at least comprise a blue light-emitting diode and at least a red light-emitting diode, and that the conversion means comprise a (green light-emitting) luminescent material for converting a portion of the light emitted by the blue light-emitting diode into green light. In this manner, a lighting system in accordance with a first aspect of the invention is obtained which emits white light with a high color rendering index on the basis of three basic colors (red, blue and green), in which only two primary light sources are employed, namely blue and red light, and green light is obtained by converting a portion of the blue light. Preferably, the maximum of the spectral emission of the blue light-emitting diode lies in the wavelength range from 460 to 490 nm, the maximum of the spectral emission of the red light-emitting diode lies in the wavelength range from 610 to 630 nm, and the maximum of the spectral emission of the (green light-emitting) luminescent material lies in the wavelength range from 510 to 530 nm.

In accordance with a second aspect of the invention, the luminescent material can be preferably excited by light originating from the wavelength range of 500 to 560 nm. By virtue of this sensitivity, the luminescent material can very suitably be used to absorb, in particular, green light. This absorbed light is very efficiently converted by the luminescent material into visible light in the further wavelength range, for example red light.

Suitable luminescent materials are CaS:Eu,Mn; CaS:Eu; SrS:Eu; (Zn,Cd)S:Ag; SrO:Eu; $Sr_3B_2O_6$: Eu; $Sr_2Mg(BO_3)_2$; CaS:Eu, Mn; CaS:Eu or SrS:Eu. Said materials have a relatively high quantum efficiency and light absorption. These materials further exhibit a relatively very high lumen equivalent when blue light or green light is converted to the desired red light.

A very attractive embodiment of the lighting system in accordance with a second aspect of the invention is characterized in that the two light-emitting diodes at least comprise a blue light-emitting diode and at least a green light-emitting diode, and that the conversion means comprise a luminescent material for converting a portion of the light emitted by the blue and/or green light-emitting diode to red light. An important advantage of the use of blue and green LEDs as the primary light source is that both diode chips can be manufactured by means of the GaN technology known per se. Unlike red GaP diode chips, such blue and green GaN diode chips are not temperature-dependent, so that the use of relatively expensive electronics to compensate for the temperature-dependence of such diode chips can be dispensed with. A further advantage resides in that said blue and green GaN diode chips can be contacted on the same side, so that they can be readily arranged in series. The use of a green-excited luminescent material emitting red light has the additional advantage with respect to a blue-excited luminescent material emitting red light that the quantum deficit is smaller. Preferably, the maximum of the spectral emission of the blue light-emitting diode lies in the wavelength range from 460 to 490 nm, the maximum of the spectral emission of the green light-emitting diode lies in the wavelength range from 510 to 550 nm, and the maximum of the spectral emission of the red light-emitting luminescent material lies in the wavelength range from 610 to 630 nm.

The color rendering index ($R_a$) of the lighting system in accordance with a first and a second aspect of the invention is preferably at least equal to or greater than 80 ($R_a \geq 80$). By a suitable combination of the spectral emissions of two primary light sources, which are formed by the at least two LEDs, and the spectral emission of one so-called secondary light source which, after conversion by the conversion means, emits visible light in the further wavelength range, a lighting system having a high color rendering index is obtained.

A point of special interest in the lighting system in accordance with the invention is that upon blending light originating from LEDs with light originating from the conversion means, the direction-dependence of light originating from LEDs (primary light sources) may differ from the direction-dependence of light originating from the conversion means (secondary light source). In general, LEDs emit highly directional light, while the conversion means, in this case the luminescent material, emit (diffuse) light in accordance with a Lambert radiator.

The invention further aims at improving the blending of light by the lighting system. To achieve this, an alternative embodiment of the lighting system in accordance with the invention is characterized in that the lighting system is further provided with reflection means. The LEDs are provided in the lighting system in such a manner that a substantial part of the light originating from the LEDs cannot directly leave the lighting system, but instead is incident on the reflection means. An advantage of the use of reflection means is that the light originating from the two primary light sources (the blue and red LEDs or the blue and green LEDs) and the secondary (green or red) light originating from the conversion means is blended. The reflection means are preferably diffusely reflecting reflection means. By directing the light originating from the LEDs to the diffusely reflecting reflection means, the reflected light also acquires the characteristics of a Lambert radiator. This results in a further improvement of the blending of the various color components and hence of the color rendition of the lighting system. Furthermore, the light is preferably reflected by the reflection means without a change of the color rendition (white-reflecting reflection means). In this manner, undesirable color deviations in the light emitted by the lighting system are precluded. Preferably, the diffusely reflecting reflection means comprise a material chosen from the group formed by $BaSO_4$, $ZnS$, $ZnO$ and $TiO_2$. Such materials are very suitable because their reflection coefficient in the wavelength range from 400 to 800 nm is above 98%, and they reflect the light in a diffuse and wavelength-independent manner.

An attractive embodiment of the lighting system in accordance with the invention is characterized in that the conversion means are provided in or on the diffusely reflecting reflection means. In this manner, the light originating from the LEDs is effectively blended, obtains the desired direction characteristic, and the conversion means additionally receive sufficient suitable light for the conversion to visible light in the further wavelength range, which converted light has the same direction characteristic as the diffusely reflected light of the LEDs.

The blending of colors and/or the direction characteristic of the emitted light can be improved in an alternative manner by covering the LEDs with a relatively thin layer of the luminescent material, whereby particles in the luminescent material act as diffusor.

It is further desirable that the color temperature of the lighting system is variable. An alternative embodiment of the lighting system in accordance with the invention is characterized in that the color temperature of the lighting system can be adjusted by separately driving the light-emitting diodes. The color temperature is (electrically) adjustable by separately driving the LEDs. A suitable embodiment of such an adjusting element includes a first diode chain of red and blue LEDs and a second diode chain of exclusively blue (or exclusively red) LEDs. A further suitable embodiment of such an adjusting element includes a first diode chain of blue and green LEDs and a second diode chain of exclusively blue (or exclusively green) LEDs. As a result thereof, an adjustable color temperature range from 2000 to 6300 K is achieved. The color temperature adjustment is partly determined by the quantity of luminescent material (conversion means).

These and other aspects of the invention will be apparent from and elucidated with reference to the embodiments described hereinafter.

BRIEF DESCRIPTION OF THE DRAWINGS

The Figures are purely schematic and not drawn to scale. Particularly for clarity, some dimensions are exaggerated strongly. In the Figures, like reference numerals refer to like parts, whenever possible.

DETAILED DESCRIPTION OF THE PREFERRED EMBODIMENTS

Figure 1A:
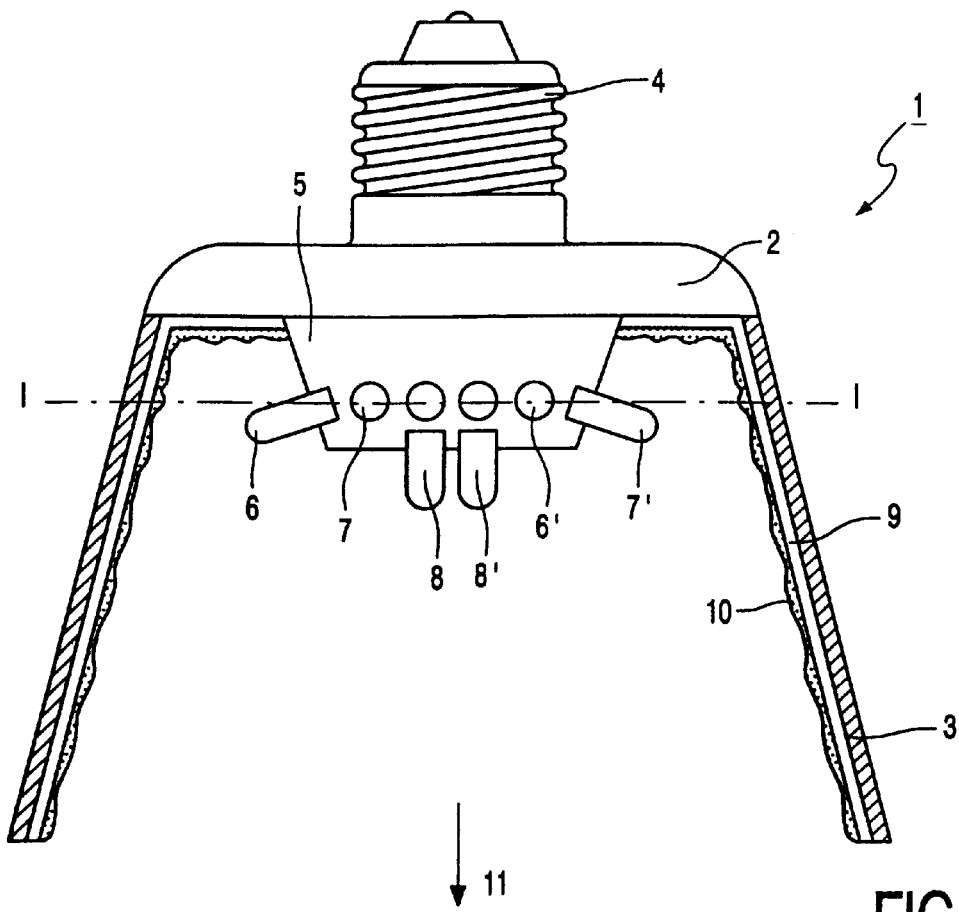
FIG. 1A is a partly cross-sectional view and a side view of an embodiment of the lighting system in accordance with a first aspect of the invention.
Figure 1B:
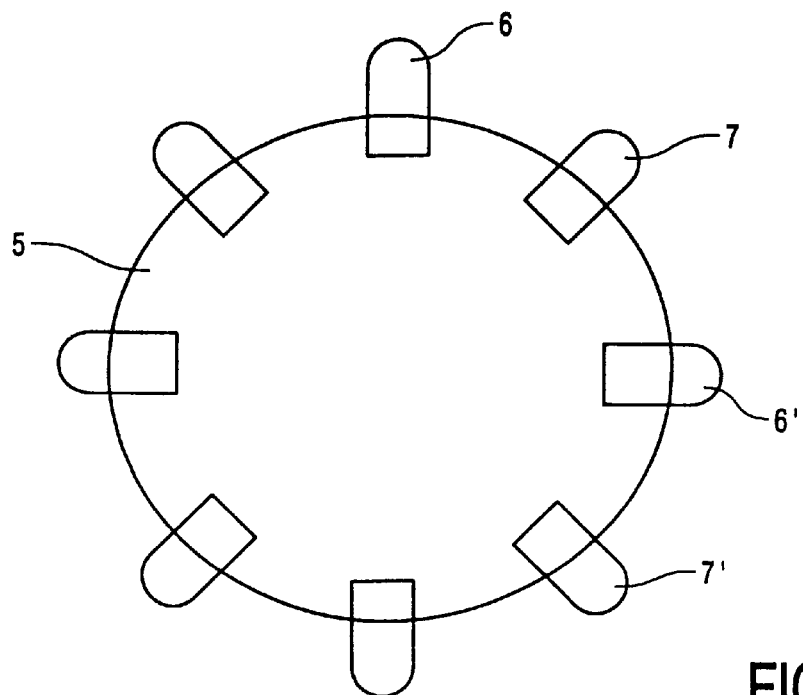
FIG. 1B is a cross-sectional view taken on the line I—I of a detail of the lighting system shown in FIG. 1A.

FIG. 1A is a partly cross-sectional view and a side view of an embodiment of the lighting system in accordance with a first aspect of the invention. A lighting system 1 comprises a housing 2 accommodating drive electronics (not shown in FIG. 1A) for the light-emitting diodes (LEDs) and a screen 3. In this example, the housing is provided with a so-called E27 lamp cap 4 having mechanical and electrical contact means which are known per se. On a side of the lighting system 1 facing away from the lamp cap 4, there is a holder 5 on which a number of LEDs 6, 6', 7, 7', 8, 8', . . . are provided. The LEDs 6, 6', 7, 7', comprise a collection of blue LEDs 6, 6', (maximum of the spectral emission lies in the wavelength range from 430 to 490 nm) and red LEDs 7, 7', (maximum of the spectral emission lies in the wavelength range from 590 to 630 nm), which LEDs 6, 6', 7, 7', . . . are arranged so that the light that they emit is directed towards the screen 3. FIG. 1B very schematically shows an example of a schematic, circular arrangement of the LEDs 6, 6', 7, 7', (sectioned via the line I—I in FIG. 1A). On a side facing the LEDs 6, 6', 7, 7' the screen 3 is provided with (diffusely reflecting) reflection means 9 and conversion means 10. In this example, the reflection means 9 comprise a layer of BaSO4, which material has a (diffuse) reflection coefficient of at least substantially 100% for visible light. The conversion means 10 preferably comprise a luminescent material (phosphor) which bears the characteristic that it converts blue light (400–480 nm) originating from the blue LEDs 6, 6', into green light in the desired further wavelength range (530–565 nm). The conversion means 10 convert visible light emitted by one of the light-emitting diodes into visible light in a range having a longer wavelength. A collection of suitable luminescent materials is shown in Table I, where for each of the materials the quantum efficiency at 450 nm ($QE_{450}$), the absorption coefficient at 450 nm ($Abs_{450}$) and the lumen equivalent (LE) is indicated.

TABLE I

Luminescent materials (so-called green emitters) which can suitably be used as conversion means for the lighting system in accordance with a first aspect of the invention.

| Phosphor | $QE_{450}$ [%] | $Abs_{450}$ [%] | LE[lm/W] |
|---|---|---|---|
| $(Sr,Ca)_2SiO_4:Eu^{2+}$ | 82 | 50 | 430 |
| $Ba_2SiO_4:Eu^{2+}$ | 64 | 40 | 474 |
| $SrGa_2S_4$ | 90 | 80 | 575 |
| $ZnS:Cu^+,Au^+,Al^{3+}$ | 56 | 55 | 505 |
| $(Zn,Cd)S:Ag^+$ | >60 | 100 | Dependent upon Zn:Cd ratio |
| $CaS:Ce^{3+}$ | 65 | 80 | 440 |

To obtain sufficient green light and to avoid losses, the screen 3 is preferably embodied and arranged so that, dependent upon the degree of reflection of the luminescent material, only one reflection occurs or a number of reflections occur. It is further desirable that the luminescent material at least substantially completely reflects the light of the red LEDs. The light of the red and blue LEDs is effectively blended by the reflection means 9, the red and blue LEDs 6, 6', 7, 7', being positioned relative to the screen 3 in such a manner that these LEDs do not directly emit their light in a direction 11 of the light emitted by the lighting system 1, but that their light output is directed towards an inside of the screen 4 in such a manner that only reflected light is emitted in the direction 11.

The red and blue LEDs can be separately driven, thus enabling the color temperature of the lighting system 1 to be varied and adjusted in accordance with the requirements. An example hereof is the application of a diode chain with red and blue LEDs and a further diode chain with exclusively blue LEDs (see also FIG. 4). This ordering of LEDs enables the portion of red light in the primary light source to be varied. Since the ratio of the blue emission relative to the green emission is fixed in such an ordering of LEDs [the blue LEDs 6, 6' are directly aimed at the layer with luminescent material ($Ba_2SiO_4:Eu^{2+}$)], the example of FIG. 1A also contains a number of further blue LEDs 8, 8', which emit very diffusely in the direction 11 of the light emitted by the lighting system 1. This measure enables the red and blue portion in the white light emitted by the lighting system 1 to be separately varied. This results in an additional setting possibility for adjusting the ratio of primary red and blue light and secondary green light, thus providing the lighting system 1 with an adjustable color temperature.

By way of example, Table II shows a lighting system in accordance with a first aspect of the invention, which comprises:

blue GaN LEDs (make Nichia) with an emission maximum at 470 nm, FWHM=20 nm;

red GaP LEDs (make Hewlett Packard) with an emission maximum at 620 nm, FWHM=20 nm, two to four blue LEDs being used for each red LED;

and conversion means comprising a layer of $Ba_2SiO_4:Eu^{2+}$.

Column 1 of Table II lists various desirable values for the color temperature ($T_c$). The columns 2, 3 and 4 of Table II list the spectral contributions (x) of the three light components (sum of the three spectral contributions x amounts to 1). Column 5 in Table II lists the color rendering index ($R_a$) and column 6 lists the luminous efficacy (lum. eff.) of the lighting system. Table II shows that the proportion of green light (column 3) varies relatively little at the different color temperatures. The color temperature of the lighting system can be readily adjusted in a very wide range by only changing the distribution of the primary light sources (the blue and red light).

In accordance with the measure of the invention, a lighting system having a relatively high color rendition ($80 \leq R_a \leq 90$) is achieved in this manner.

TABLE II

Combination of blue and red LEDs and $Ba_2SiO_4:Eu^{2+}$ as a luminescent material in an embodiment of the lighting system in accordance with a first aspect of the invention.

| $T_c$ [K] | x [blue LED] | x [$Ba_2SiO_4:Eu^{2+}$] | x [red LED] | $R_a$ | lum.eff. [lm/W] |
|---|---|---|---|---|---|
| 2700 | 0.069 | 0.537 | 0.394 | 89 | 21.5 |
| 2900 | 0.108 | 0.539 | 0.353 | 89 | 22.0 |
| 4000 | 0.186 | 0.578 | 0.236 | 88 | 22.8 |
| 5000 | 0.251 | 0.568 | 0.182 | 84 | 23.0 |
| 6300 | 0.302 | 0.572 | 0.126 | 80 | 23.4 |

Figure 2:
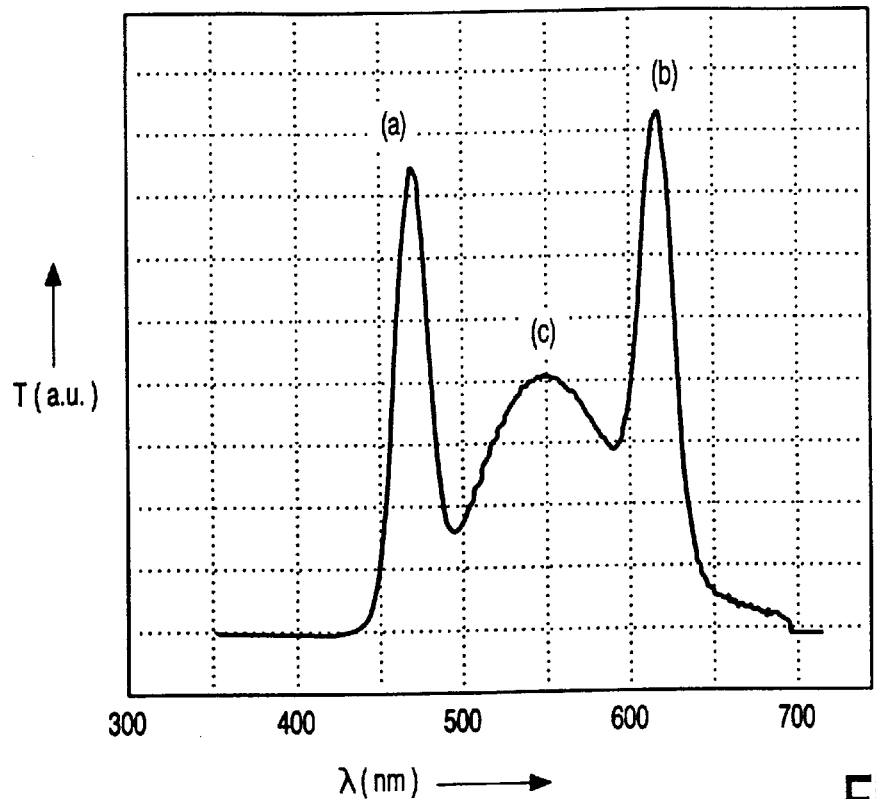
FIG. 2 shows the transmission spectrum of an embodiment of the lighting system in accordance with the invention.

FIG. 2 shows the transmission spectrum of an embodiment of the lighting system in accordance with the invention. The transmission T (arbitrary units) is plotted as a function of the wavelength λ (nm) of visible light for a combination of blue and red LEDs and $Ba_2SiO_4:Eu^{2+}$ as the luminescent material at a color temperature $T_c$=4000 K (the spectrum in FIG. 2 corresponds to the data in column 4 of Table II). In FIG. 2, the spectral maximum of the blue LEDs is indicated by (a) and corresponds to a wavelength of 470 nm, and the spectral maximum of the red LEDs is indicated by (b) and corresponds to a wavelength of 620 nm. Furthermore, in FIG. 2, the spectral maximum of the light emitted by the luminescent material is indicated by (c) and corresponds to a wavelength of 550 nm.

A further improvement of the color rendering index $R_a$) in accordance with a first aspect of the invention is achieved by not only employing red and blue LEDs as sources of primary light but, for example, a combination of 4 different LEDs. A particularly suitable lighting system in accordance with a first aspect of the invention comprises:

blue GaN LEDs (make Nichia): emission maximum: 470 nm, FWHM=20 nm;

blue-green GaN LEDs (make Nichia): emission maximum: 520 nm, FWHM=40 nm;

yellow GaP LEDs (make Hewlett Packard): emission maximum: 590 nm, FWHM=20 nm;

red GaP LEDs (make Hewlett Packard): emission maximum: 620 nm, FWHM=20 nm;

and conversion means comprising a layer of $Ba_2SiO_4:Eu^{2+}$.

A lighting system having such a combination of four light-emitting diodes and the conversion means in accordance with a first aspect of the invention has a color rendering index which, relative to the various color temperatures listed in Table II, is at least 10 points higher than in the case of a combination of two diodes ($R_a \geq 90$). Such a lighting system has a luminous efficacy beyond 20 lm/W. For comparison, a typical 100 W incandescent lamp has a luminous efficacy of 14 lm/W (color temperature 2800 K, color rendering index 100), a 500 W halogen incandescent lamp has a luminous efficacy of approximately 19 lm/W (color temperature 3000 K, color rendering index 100), while a 36 W fluorescent lamp has a luminous efficacy of approximately 90 lm/W (color temperature 4000 K, color rendering index 85). A further improvement of the color rendition of the lighting system is achieved by employing deep red LEDs with a spectral emission maximum in the wavelength range from 620 to 670 nm.

Figure 3A:
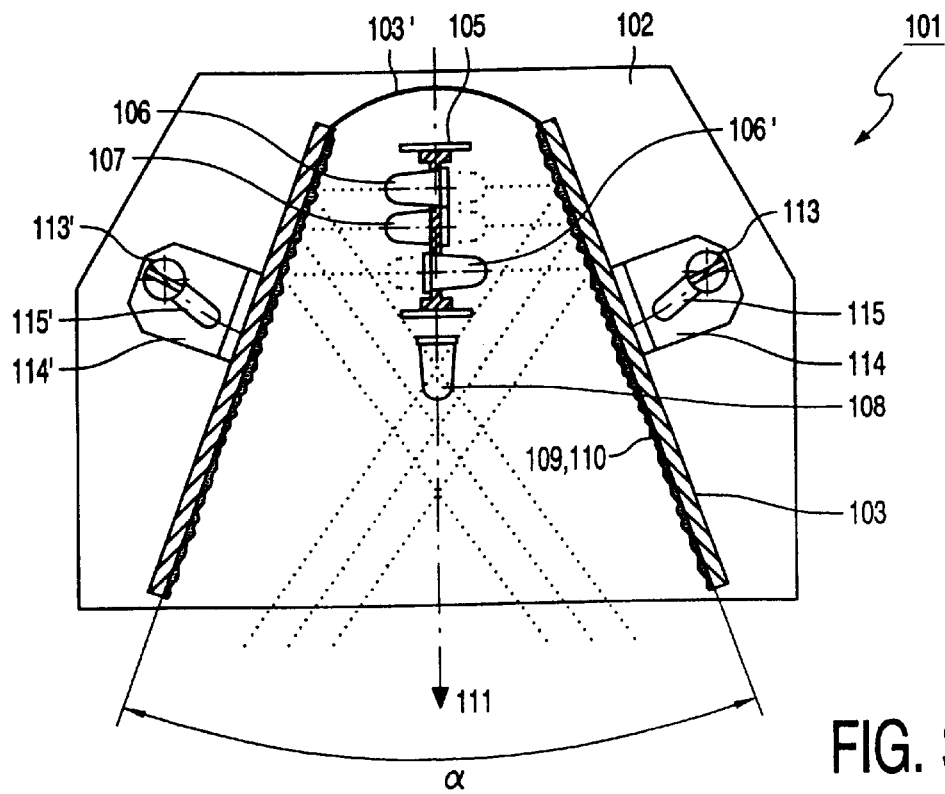
FIG. 3A is a cross-sectional view of an alternative embodiment of the lighting embodiment of the lighting system in accordance with a first aspect of the invention.
Figure 3B:
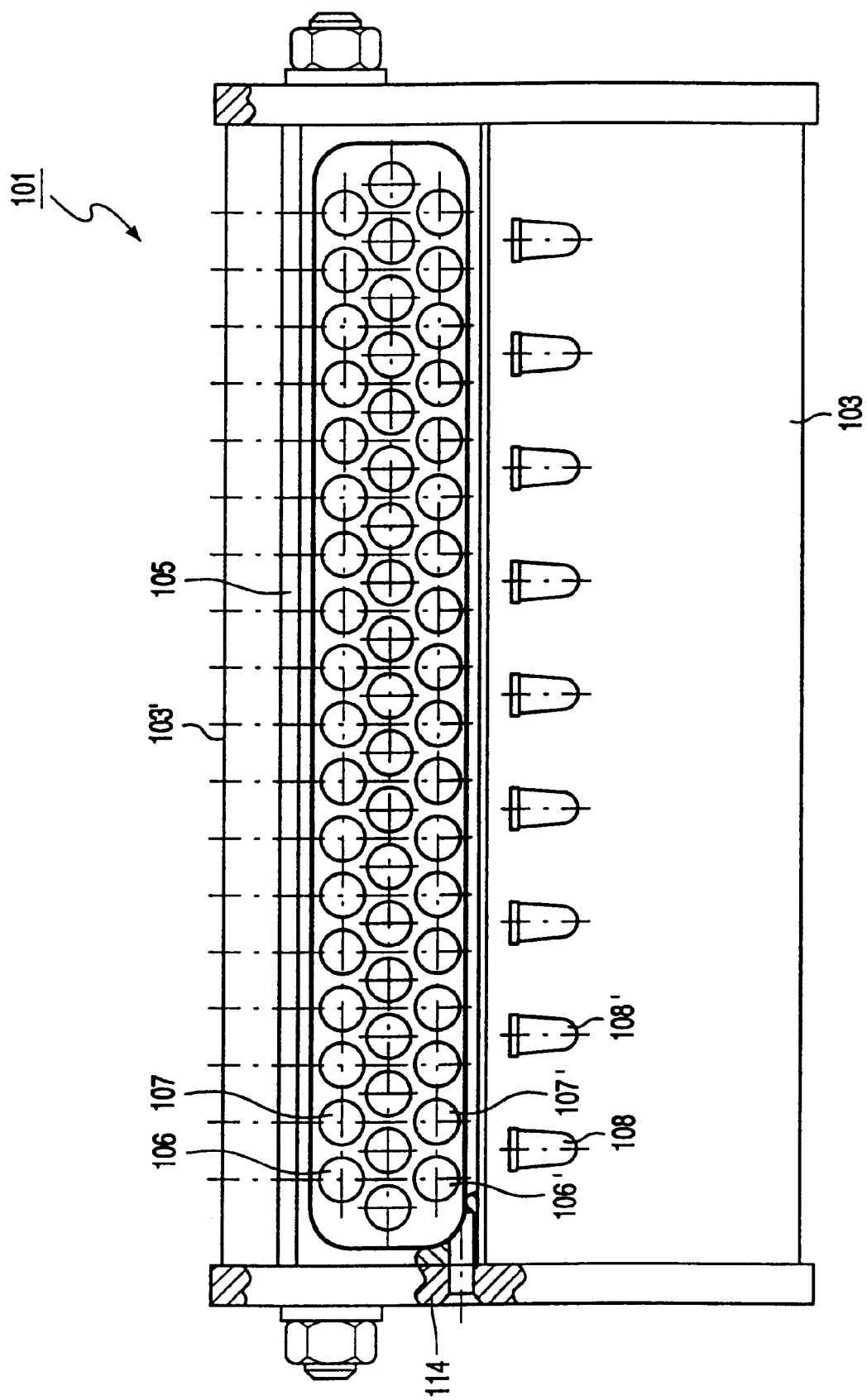
FIG. 3B is a cross-sectional view of a side view of the alternative embodiment of the lighting system shown in FIG. 3A.

FIG. 3A shows an alternative embodiment of the lighting system in accordance with a first aspect of the invention. FIG. 3B is a cross-sectional view of a side elevation of the embodiment shown in FIG. 3A. The lighting system 101 comprises a housing 102 and a screen 103. This example includes an aperture angle α at which light leaves the lighting system 101 in a direction 111, which angle can be varied via adjusting screws 113, 113'. For this purpose, the screen is provided with adjusting plates 114, 114' having elongated or groove-shaped apertures 115, 115'. In the example shown in FIG. 3A, the aperture angle α is equal to 40°. The lighting system 101 comprises a holder 105 on which a number of LEDs 106, 106', 107, 107', 108, 108', are provided. The LEDs 106, 106', 107, 107' include an alternating collection of blue LEDs 106, 106' (spectral emission $430 \leq \lambda \leq 490$ nm) and red LEDs 107, 107', . . . (spectral emission $590 \leq \lambda \leq 630$ nm), which LEDs 106, 106', 107, 107' are arranged in such a manner that the light which they emit is directed towards the screen 103 (the direction of the light is schematically indicated by the dotted horizontal light rays in FIG. 3A). In this example, a part 103' of the screen 103 comprises an aluminum reflector which may or may not be covered with reflection means, for example a layer of a white pigment, such as $BaSO_4$. Said screen 103 is further provided, on a side facing the LEDs 106, 106', 107, 107' with a mixture of reflection means 109 ($BaSO_4$) and conversion means 110, which conversion means preferably include a luminescent material having the property that it converts blue light (400–480 nm) to green light (530–565 nm). A collection of suitable luminescent materials is listed in Table I. The path of the light rays emitted by the LEDs 106, 106', 107, 107', and subsequently reflected, is schematically shown in FIG. 3A by means of dotted lines. The example shown in FIGS. 3A, 3B also includes a number of further blue LEDs 108, 108', which exhibit a very diffuse emission in the direction 111 of the light emitted by the lighting system 101.

Figure 4:
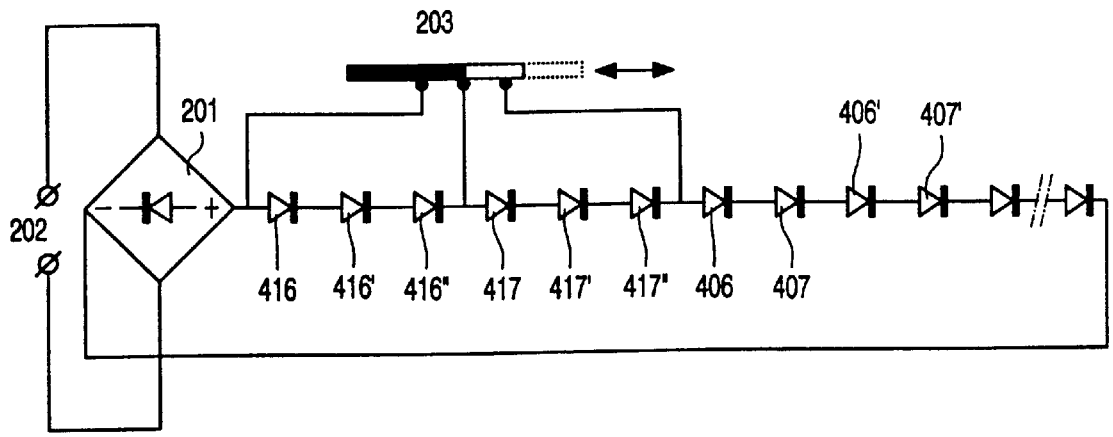
FIG. 4 is a circuit diagram of LEDs for use in a lighting system in accordance with the invention having an adjustable color temperature.

FIG. 4 shows a circuit diagram of LEDs for use in a lighting system in accordance with the invention having an adjustable color temperature. A voltage is guided from a supply source 202 via a diode bridge 201 to an arrangement of blue LEDs 406, 406' and red LEDs 407, 407'. By means of a selector switch 203, further groups of blue LEDs 416, 416' and/or red LEDs 417, 417' can be switched on or off in accordance with the requirements.

Figure 5:
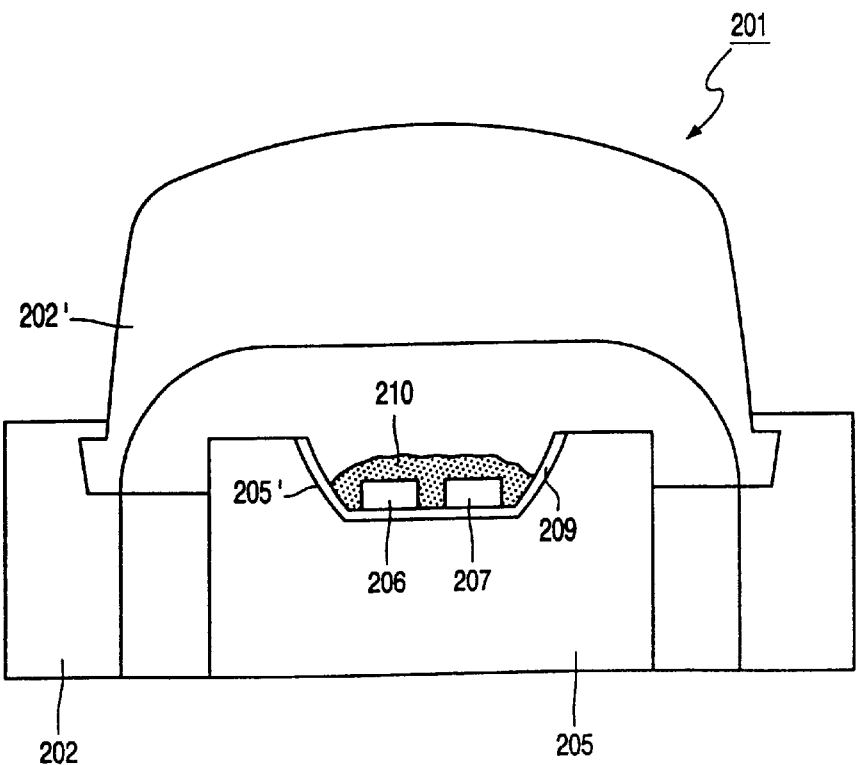
FIG. 5 is a cross-sectional view of an embodiment of the lighting system in accordance with a second aspect of the invention.

FIG. 5 is a cross-sectional view of an embodiment of the lighting system in accordance with a second aspect of the invention. The lighting system 201 comprises a housing 202, 202', which accommodates a holder 205 on which a number of LEDs 206;207 are provided. The LEDs 206; 207 include an alternating collection of blue LEDs 206 (spectral emission $430 \leq \lambda \leq 490$ nm) and green LEDs 207 (spectral emission $510 \leq \lambda \leq 550$ nm), which LEDs 206, 207 are arranged in such a manner that the light which they emit is directed towards an optically transparent part of the housing 202'. In this example, a part of the holder 205' comprises a copper reflector which is covered with reflection means 209, for example a silver layer. In this example, the LEDs are covered with conversion means 210, which conversion means preferably include a luminescent material having the property that it converts green light (530–565 nm) to red light (610–630 nm). Suitable phosphors which convert blue light to red light are: CaS:Eu, Mn; CaS:Eu; SrS:Eu; (Zn, Cd)S:Ag; SrO:Eu (emission maximum at 625 nm); $Sr_3B_2O_6$:Eu (emission maximum at 590 nm); and $Sr_2Mg(BO_3)_2$ (emission maximum at 605 nm). Suitable phosphors which convert green light to red light are: CaS:Eu, Mn or CaS:Eu ($\leq 550$ nm) or SrS:Eu ($\leq 540$ nm).

A very suitable lighting system in accordance with a second aspect of the invention comprises:

blue GaN LEDs (make Nichia) with an emission maximum at 470 nm, FWHM=20 nm;

green GaN LEDs (make Nichia) with an emission maximum at 530 nm, FWHM=20 nm;

two or three green LEDs (dependent upon the required color temperature) being used for each blue LED;

and conversion means comprising a layer of CaS:Eu, Mn.

The lighting system in accordance with the invention has the advantage that a high color rendition is achieved ($R_a \geq 80$) in combination with a relatively high luminous efficacy ($\geq 20$ lm/W) and a long service life ($\geq 75,000$ hours).

It will be obvious that within the scope of the invention many variations are possible to those skilled in the art.

The scope of protection of the invention is not limited to the examples given in this document. The invention is embodied in each novel characteristic and each combination of characteristics. Reference numerals in the claims do not limit the scope of protection of said claims. The use of the term "comprising" does not exclude the presence of elements other than those mentioned in the claims. The use of the term "a" or "an" in front of an element does not exclude the presence of a plurality of such elements.

What is claimed is:

1. A lighting system comprising at least two light-emitting diodes, each of said at least two light-emitting diodes emitting, in operation, visible light in a preselected wavelength range, and conversion means for converting a part of the visible light emitted by one of the at least two light-emitting diodes into visible light in a further wavelength range so as to optimize the color rendition of the lighting system;

wherein the at least two light-emitting diodes comprise at least a blue light-emitting diode and at least a red light-emitting diode; and wherein the conversion means include a luminescent material for converting a portion of the light emitted by the blue light-emitting diode into green light.

2. A lighting system as claimed in claim 1, wherein the luminescent material can be excited by light originating from one of a wavelength range from 400 to 500 nm and another wavelength range from 500 to 560 nm.

3. A lighting system as claimed in claim 1, wherein the luminescent material is chosen from one of a group formed by $(Sr,Ca)_2SiO_4:Eu^{2+}$, $Ba_2SiO_4:Eu^{2+}$, $SrGa_2S_4$, $ZnS:Cu^+$, $ZnS:Au^+$, $ZnS:Al^{3+}$, $(Zn,Cd)S:Ag^+$ and $CaS:Ce^{3+}$, and another group formed by CaS:Eu,Mn; CaS:Eu; SrS:Eu; (Zn,Cd)S:Ag; SrO:Eu; $Sr_3B_2O_6$:Eu; $Sr_2Mg(BO_3)_2$; CaS:Eu, Mn; CaS:Eu or SrS:Eu.

4. A lighting system comprising at least two light-emitting diodes, each of said at least two light-emitting diodes emitting, in operation, visible light in a preselected wavelength range, and conversion means for converting a part of the visible light emitted by one of the at least two light-emitting diodes into visible light in a further wavelength range so as to optimize the color rendition of the lighting system;

wherein the at least two light-emitting diodes at least comprise a blue light-emitting diode and at least a green light-emitting diode, and wherein the conversion means comprise a luminescent material for converting a portion of the light emitted by at least one of the blue and green light-emitting diodes to red light.

5. A lighting system as claimed in claim 1, wherein a color rendering index of the lighting system is at least equal to or greater than 80.

6. A lighting system as claimed in claim 1 wherein, in operation, each of the at least two light-emitting diodes has a luminous flux of at least 5 lm.

7. A lighting system comprising at least two light-emitting diodes, each of said at least two light-emitting diodes emitting, in operation, visible light in a preselected wavelength range;

conversion means for converting a part of the visible light emitted by one of the at least two light-emitting diodes into visible light in a further wavelength range so as to optimize the color rendition of the lighting system; and reflection means.

8. A lighting system as claimed in claim 7, wherein the reflection means comprise a material chosen from the group formed by $BaSO_4$, ZnS, ZnO and $TiO_2$.

9. A lighting system as claimed in claim 7, wherein the conversion means are provided in or on the reflection means.

10. A lighting system comprising at least two light-emitting diodes, each of said at least two light-emitting diodes emitting, in operation, visible light in a preselected wavelength range;

conversion means for converting a part of the visible light emitted by one of the at least two light-emitting diodes into visible light in a further wavelength range so as to optimize the color rendition of the lighting system; and means for separately driving the at least two light-emitting diodes.

11. A lighting system as claimed in claim 7, wherein the conversion means comprise a luminescent material.

12. A lighting system as claimed in claim 11, wherein the luminescent material can be excited by light originating from one of a wavelength range from 400 to 500 nm and another wavelength range from 500 to 560 nm.

13. A lighting system as claimed in claim 11, wherein the luminescent material is chosen from one of a group formed by $(Sr,Ca)_2SiO_4:Eu^{2+}$, $Ba_2SiO_4:Eu^{2+}$, $SrGa_2S_4$, $ZnS:Cu^+$, $ZnS:Au^+$, $ZnS:Al^{3+}$, $(Zn,Cd)S:Ag^+$ and $CaS:Ce^{3+}$, and another group formed by CaS:Eu,Mn; CaS:Eu; SrS:Eu; (Zn,Cd)S:Ag; SrO:Eu; $Sr_3B_2O_6$:Eu; $Sr_2Mg(BO_3)_2$; CaS:Eu, Mn; CaS:Eu or SrS:Eu.

14. A lighting system as claimed in claim 7, wherein a color rendering index of the lighting system is at least equal to or greater than 80.

15. A lighting system as claimed in claim 7 wherein, in operation, each of the at least two light-emitting diodes has a luminous flux of at least 5 lm.

16. A lighting system as claimed in claim 10, wherein the conversion means comprise a luminescent material.

17. A lighting system as claimed in claim 16, wherein the luminescent material can be excited by light originating from one of a wavelength range from 400 to 500 nm and another wavelength range from 500 to 560 nm.

18. A lighting system as claimed in claim 16, wherein the luminescent material is chosen from one of a group formed by $(Sr,Ca)_2SiO_4:Eu^{2+}$, $Ba_2SiO_4:Eu^{2+}$, $SrGa_2S_4$, $ZnS:Cu^+$, $ZnS:Au^+$, $ZnS:Al^{3+}$, $(Zn,Cd)S:Ag^+$ and $CaS:Ce^{3+}$, and another group formed by CaS:Eu,Mn; CaS:Eu; SrS:Eu; (Zn,Cd)S:Ag; SrO:Eu; $Sr_3B_2O_6$:Eu; $Sr_2Mg(BO_3)_2$; CaS:Eu, Mn; CaS:Eu or SrS:Eu.

19. A lighting system as claimed in claim 10, wherein a color rendering index of the lighting system is at least equal to or greater than 80.

20. A lighting system as claimed in claim 10 wherein, in operation, each of the at least two light-emitting diodes has a luminous flux of at least 5 lm.

* * * * *